United States Patent [19]
Carl et al.

[11] Patent Number: 5,629,634
[45] Date of Patent: May 13, 1997

[54] LOW-POWER, TRISTATE, OFF-CHIP DRIVER CIRCUIT

[75] Inventors: Allen R. Carl, Essex Junction; Ronald A. Piro, Williston, both of Vt.

[73] Assignee: International Business Machines Corporation, Armonk, N.Y.

[21] Appl. No.: 517,227

[22] Filed: Aug. 21, 1995

[51] Int. Cl.$^6$ ............................................. H03K 19/0185
[52] U.S. Cl. .................................. 326/27; 326/58; 326/83
[58] Field of Search ............................... 326/83, 89, 27, 326/58

[56] References Cited

U.S. PATENT DOCUMENTS

| | | |
|---|---|---|
| 4,477,741 | 10/1984 | Moser, Jr. . |
| 4,612,466 | 9/1986 | Stewart . |
| 4,782,250 | 11/1988 | Adams et al. . |
| 4,825,099 | 4/1989 | Barton . |
| 4,952,818 | 8/1990 | Erdelyi et al. . |
| 4,963,766 | 10/1990 | Lundberg ............................... 326/81 |
| 4,975,598 | 12/1990 | Borkar . |
| 5,017,807 | 5/1991 | Kriz ........................................ 326/83 |
| 5,021,684 | 6/1991 | Ahuja ..................................... 326/83 |
| 5,117,129 | 5/1992 | Hoffman ................................. 326/83 |
| 5,179,299 | 1/1993 | Tipon . |
| 5,206,544 | 4/1993 | Chen et al. . |
| 5,212,801 | 5/1993 | Farmer . |
| 5,243,571 | 9/1993 | Brossard . |
| 5,280,204 | 1/1994 | Livolsi . |
| 5,321,319 | 6/1994 | Mahmood . |
| 5,331,228 | 7/1994 | Brady . |
| 5,332,932 | 7/1994 | Runaldue . |
| 5,394,363 | 2/1995 | Han . |
| 5,396,128 | 3/1995 | Dunning et al. . |
| 5,399,925 | 3/1995 | Nguyen . |
| 5,408,146 | 4/1995 | Nguyen et al. . |
| 5,430,387 | 7/1995 | Bechade .................................. 326/27 |
| 5,444,397 | 8/1995 | Wong ...................................... 326/27 |
| 5,450,025 | 9/1995 | Shay ....................................... 326/81 |
| 5,467,031 | 11/1995 | Nguyen ................................... 326/81 |

Primary Examiner—Edward P. Westin
Assistant Examiner—Benjamin D. Driscoll
Attorney, Agent, or Firm—Robert Walsh

[57] ABSTRACT

An output driver circuit for a semiconductor chip has a push-pull output with a P-channel pull-up and an N-channel pull-down. Predrivers produce push-pull outputs for driving the gates of the output driver. Compensator circuits, one for the N-channel pull-down, and one for the P-channel pull-up, are used to prevent the transition from high-to-low or low-to-high from being too rapid, which could cause noise due to inductance of the package leads. A feedback circuit halts the operation of the compensator circuits after a short interval. An overvoltage circuit formed in a well of the semiconductor chip holding the driver circuit, having an input coupled to receive the data output of the predriver circuit going to the P-channel pull-up, also functions to prevent damage to the output driver circuit due to overvoltage on the output node. A stack of diodes connected in a forward direction between the N-well of the P-channel pull-up transistor and the positive terminal of the voltage supply serves to clamp the output node if it tends to go above a selected overvoltge level.

14 Claims, 3 Drawing Sheets

LOW-POWER, TRISTATE, OFF-CHIP DRIVER CIRCUIT

BACKGROUND OF THE INVENTION

1. Technical Field

This invention relates to driver circuits for integrated circuit chips, and more particularly to a CMOS driver circuit for producing outputs from an integrated circuit device to off-chip environments where overvoltages may occur, and where simultaneous switching noise is a concern.

2. Description of the Related Art

A computer system requires a number of integrated circuit devices such as microprocessor or memory chips to be connected to high performance bus architectures, many of which encompass multi-voltage environments. These environments may introduce bus over-voltages that exceed the reliability specification for the driver circuits used at the output pads of the microprocessor or memory I/C's, especially if the IC's are designed in a low-voltage technology, e.g., 3 V power supply devices.

One of the most widely used techniques for preventing overvoltage damage to a CMOS output driver is taught in U.S. Pat. No. 5,151,619, where a circuit is shown which uses an N-well containing a transistor shunting the gate and drain of the P-channel pull-up transistor, so that this gate follows the output node if it goes above the supply. The N-well is sourced through a transistor, instead of directly from the supply.

Another example of integrated circuit chip technology wherein voltage supplies are of mixed values is disclosed by M. Ueda, et al, in "A 3.3 V ASIC for Mixed Voltage Applications With Shut Down Mode," Custom Integrated Circuits Conference, May 1993, pages 25.5.1–25.5.4.

A factor in the design of a CMOS output driver is the effect of lead inductance in the package. The connections from the output pads of an integrated circuit chip to the leads of the package itself tend to act as inductive elements, and will introduce noise by bumping the ground voltage and supply voltage at times of rapid transition between one and zero levels. Previous attempts to deal with this factor have included a compensating circuit which prevents the transition from being too rapid, yet does not unduly compromise the speed of the circuit. This type of compensating circuit must be reconciled with the possibility of overvoltage on the output node, however.

SUMMARY OF THE INVENTION

It is therefore one object of the present invention to provide an improved push-pull output driver for CMOS technologies.

It is another object of the present invention to provide an improved method of preventing overvoltage from damaging an output circuit when a semiconductor device is connected to external buses.

It is a further object of the present invention to provide an improved method of minimizing inductive simultaneous switching noise in the ground and supply lines when rapid transitions of the output occur, and to tailor such a method to overvoltage protection.

The above as well as additional objects, features, and advantages of the present invention will become apparent in the following detailed written description.

According to one embodiment of the invention, an output driver circuit for a semiconductor chip has a push-pull output with a P-channel pull-up and an N-channel pull-down. Predrivers produce push-pull outputs for driving the gates of the output driver. Compensator circuits, one for the N-channel pull-down, and one for the P-channel pull-up, are used to prevent the transition from high-to-low or low-to-high from being too rapid, which could cause noise due to the inductance of the package leads. A feedback circuit halts the operation of the compensator circuits once the transition has occurred. An overvoltage circuit formed in a well of the semiconductor chip holding the driver circuit, having an input coupled to receive the data output of the predriver circuit going to the P-channel pull-up, also functions to prevent damage to the output driver circuit due to overvoltage on the output node. A stack of diodes connected in a forward direction between the N-well of the P-channel pull-up transistor and the positive terminal of the voltage supply serves to clamp the output node if it tends to go above a selected overvoltge level.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
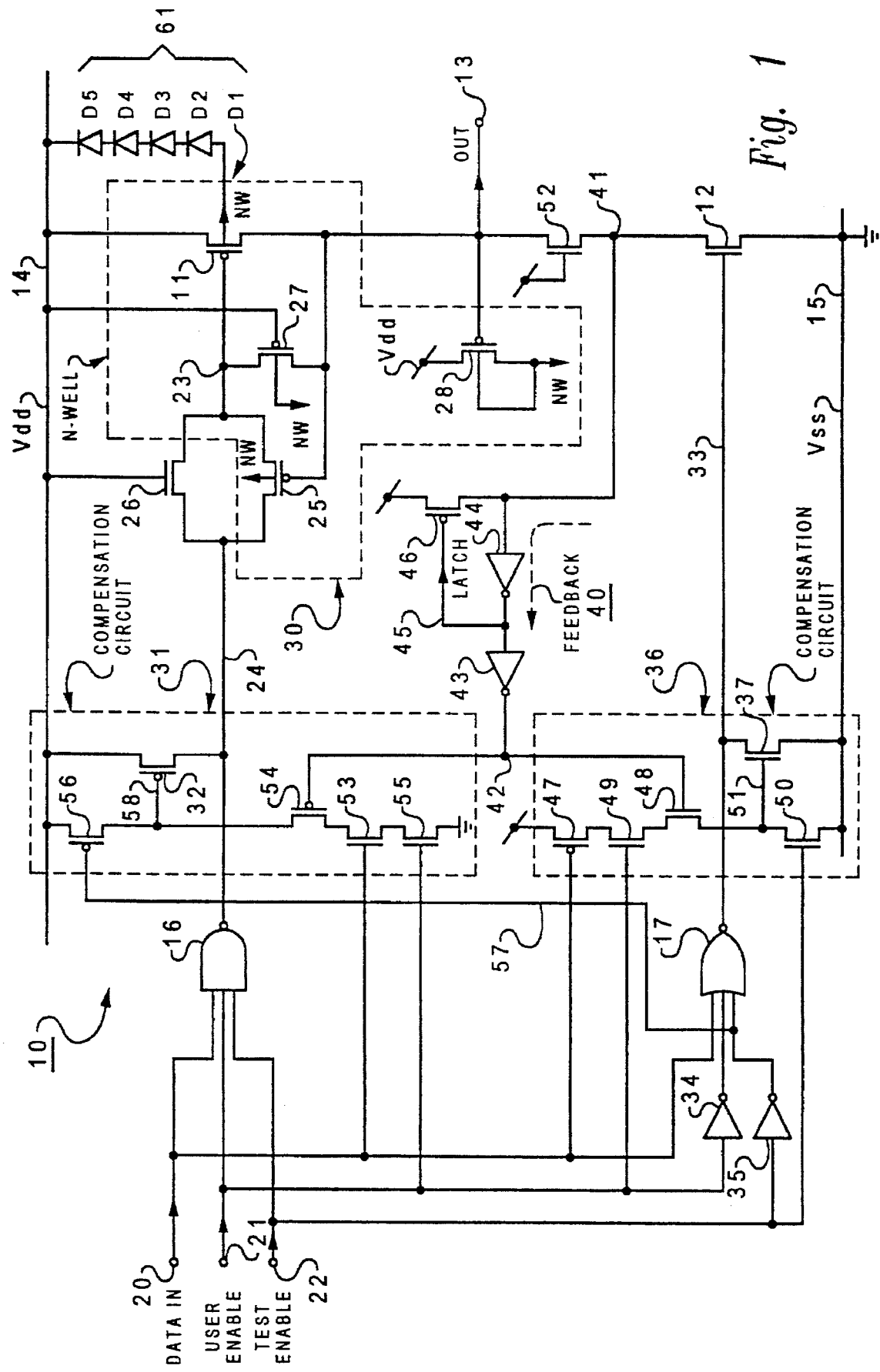
FIG. 1 is an electrical schematic diagram of an output driver circuit which is constructed using features of one embodiment of the present invention.

Referring to FIG. 1, a CMOS output driver circuit 10 is illustrated according to one embodiment of the invention. The circuit 10 is typically part of a microprocessor chip, a memory chip, or a special-purpose logic circuit (called ASIC or application specific integrated circuit). This circuit uses a pair of push-pull output transistors including a P-channel output driver transistor 11 and an N-channel output driver transistor 12, driving an output node 13 between the two. The output node 13 is usually a pad of the integrated circuit chip, connected to a high-performance bus external to the chip. There may be a large number of these outputs 13 for a microprocessor or ASIC chip, driving several system buses, including 32-bit or 64-bit data buses, as well as address buses, for example. In a mixed supply environment, these buses may have momentary over-voltages on them of as much as double or triple the chip supply voltage or normal logic-level voltage. Typically the chip in which the circuit 10 is constructed would use a supply voltage of 3 V, while other chips driving the buses may use a 5 V supply. The push-pull output driver transistors 11 and 12 are connected in series between a $V_{cc}$ line 14 and a $V_{ss}$ line 15, where the voltage supply represented by these lines 14 and 15 is perhaps 3-Volts. With a low voltage supply such as this, the possibility of overvoltage on the output pad 13 is significant, and the overvoltage could cause damage to transistors in the output buffer, or sink large current spikes into the power supply.

The output transistors 11 and 12 are driven by a predriver or control circuit including a NAND gate 16 and a NOR gate 17. These gates are constructed of any known, suitable predriver technology, and have as inputs a Data pin 20 and two Enable pins 21 and 22. The Enable pins are used to force a high-impedance condition on the driver output pad 13, and to shut off any flow-through current paths in the noise compensation circuits. This high-impedance condition is one where both of the push-pull output transistors 11 and 12 are off so that the node 13 sees a very high impedance looking back into the output driver circuit. There are two of the Enable pins, a User Enable pin 21 and a Test Enable pin 22. The User Enable pin 21 is used during normal circuit operation, while the Test Enable pin 22 is used only during device test and in the description below it is assumed that the Test Enable pin stays high.

The function of the NAND gate 16 is to set up a condition where the gate node 23 for the P-channel pull-up transistor 11 is low, near $V_{ss}$, when the Data input pin 20 is high, producing a "1" level output on node 13. Thus, if the two Enable pins 21 and 22 are high, the output 24 of the gate 16 is low, and the gate 23 will be low, since the P- and N-channel transistors 25 and 26 function merely as a pass gate. A P-channel transistor 27 having its gate at $V_{dd}$ shunts the gate 23 and the drain of output transistor 11 (output node 13). The output node 13 is also connected to the gate of a P-channel transistor 28, which has its drain connected to the N-well in which the transistor is formed, so that when the output 13 is low the $V_{dd}$ supply is connected through the source-to-drain path of the transistor 28 to the well. All of the P-channel transistors 11, 25, 27 and 28 are in an N-well 30 which is sourced by the transistor 28, functioning to prevent overvoltage on the output node 13 from damaging the driver circuit, as will be explained. Another feature for insuring proper voltage on the nodes 23 and 24 driving the gate of the pull-up transistor 11 is a compensating circuit 31 including a transistor 32 shunting the node 24 to $V_{dd}$ line 14 under certain conditions. The function of the compensating circuit 31 is explained below.

The function of the NOR gate 17 is to set up a condition where the gate node 33 for the N-channel pull-down transistor 12 is high, near $V_{dd}$, when the Data input pin 20 is low, turning on this transistor 12 and producing a "0" level output on node 13. Thus, if the two Enable pins 21 and 22 are high, the inverters 34 and 35 cause "0" inputs to the NOR gate, so the Data input 20 will control the inverted NOR output on line 33. When Data input 20 is high, the NOR output is low, and vice versa. As above, an important feature for insuring proper voltage on the node 33 driving the gate of the pull-down transistor 12 is a compensating circuit 36 including a transistor 37 shunting current from the node 33 to $V_{ss}$ line 15 under certain conditions.

A feedback circuit 40 connects the output at the drain 41 of the pull-down transistor 12 to an input 42 to the two compensating circuits 31 and 36. The feedback path 40 includes two inverters 43 and 44 which function as a delay circuit, and a path via line 45 and P-channel transistor 46 produces a latch function. When the node 41 goes high, indicating a "1" output, the line 45 goes low, turning on the P-channel transistor 46, which applies a $V_{dd}$ voltage to the input of the inverter 44, holding the "1" condition; this "1" condition applies a "1" to the input 42 of the compensating circuits, at node 42, shutting off the effect of the compensating circuits.

Figure 2:
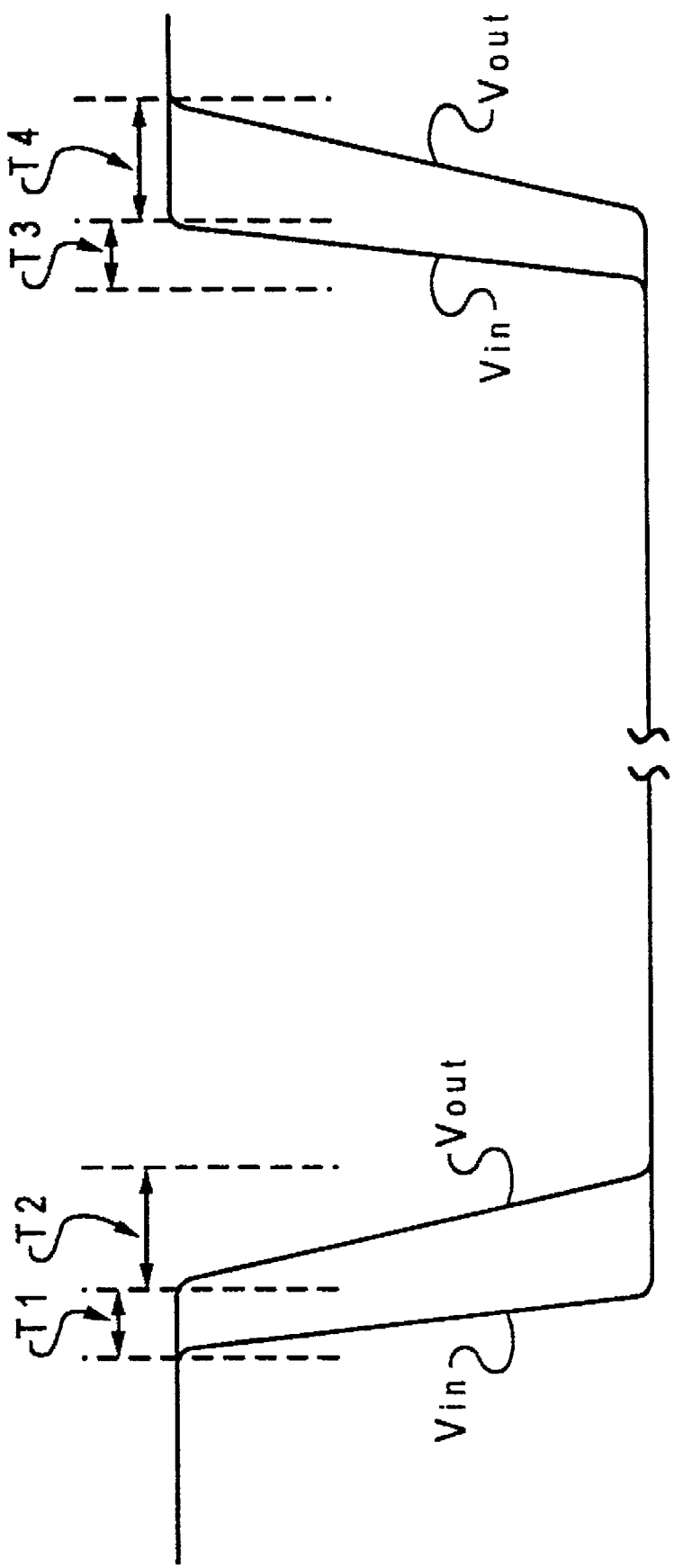
FIG. 2 is a timing diagram showing voltage vs. time for waveforms in the circuit of FIG. 1.

The following description of the driver circuit uses the example of a Hi-to-Low transition of the input voltage $V_{in}$ on the Data pin 20, as seen in FIG. 2. During normal chip operation, both of the Enable pins 21 and 22 are held in a high state, permitting the driver output 13 to toggle with the Data input pin 20. That is, when $V_{in}$ on the Data input pin 20 goes low, the output pad 13 goes low as seen by the line $V_{out}$ in FIG. 2, and when the data input goes high, the output goes high. So, when the Data pin 20 is toggled from High to Low, the output 13 is momentarily high during a period $T_1$ before it has had time to begin the low transition, and in this condition a P-channel transistor 47 and an N-channel transistor 48 in the compensating circuit 36 are both held in an on condition. An N-channel transistor 49 is also held on by the User Enable voltage, and an N-channel transistor 50 is held on by the Test Enable voltage, so all four of the series-connected transistors 47–50 in the compensating circuit 36 are on; this sets a bias point on the gate 51 of the transistor 37. This gate bias on transistor 37 partially turns on the device so that it will sink a finite amount of current from the node 33 in order to contend with the current being sourced to the node 33 by the gate 17, which is producing a high output at this point. This contention acts as a means to retard a rapid voltage increase on node 33 that would turn on the pull-down transistor 12 too quickly and produce a large amount of ground current. Excessive ground current flowing through the inductive elements of the package environment and bus circuitry will create noise. By the term "rapid," in this context, is meant a slope of the Hi-to-Low or Low-to-Hi transition in the output voltage $V_{out}$ in FIG. 2 that would cause this noise in the package environment, and generally this means that the compensator circuits reduce this slope to less than that of the input voltage $V_{in}$; the actual fall-time and rise-time values would depend upon a particular circuit design and package technology.

As the output node 13 falls from high to low during a period $T_2$ of FIG. 2, the inverters 43 and 44 begin to change states and ultimately serve to shut off the compensation circuit 36 by putting the transistor 48 in an off state. This transistor 48 also inhibits DC current flow through the compensation circuit while the Data pin 20 remains low. The inverters 43 and 44 also provide a needed delay to allow the compensation circuitry to work effectively, i.e., perform its function during the early part of a transition then shut off and allow the outputs of the predrivers to control. The transistor 46 acts as a half latch to fully shut off the P-channel pull-up in the inverter 44; without this device, DC current would flow through the inverter 44 due to the fact that there is a threshold drop across the transistor 52, hence, a full rail voltage would not be achievable on the input of the inverter 44 without the transistor 46. The transistor 52 protects the pull-down transistor 12 from so-called hot-electron degradation caused by an overvoltage on the node 13, and it is noted that taking the feedback at node 41 instead of node 13 prevents overvoltage from reaching the transistor 46 or the input devices of the inverter 44. Once the output node 13 has reached a low state, after time $T_2$ the driver circuit 10 enters a static mode in which no DC power is consumed.

Operation of the driver circuit of FIG. 1 for a low-to-high transition during time periods $T_3$ and $T_4$ of FIG. 2 is analogous to the example just given, except for the device types; the pull up transistor 11 is P-channel, and P-channel transistors are in the compensating circuit 31. When the Data pin 20, voltage $V_{in}$, is toggled from Low to High during $T_3$, the voltage $V_{out}$ on output 13 is momentarily low before it has had time to begin the high transition, and in this condition an N-channel transistor 53 and a P-channel transistor 54 in the compensating circuit 31 are both held in an on condition. An N-channel transistor 55 is also held on by the User Enable voltage, and a P-channel transistor 56 is held on by the inverted Test Enable voltage (via line 57), so all four of the series-connected transistors 53–56 in the compensating circuit 31 are on; this sets a bias point on the gate 58 of the transistor 32. This gate bias on transistor 32 partially turns on the device so that it will supply a finite amount of current to the node 24 in order to contend with the current being sunk from the node 24 by the gate 16, which is producing a low output at this point. Again, this contention acts as a means to retard a rapid voltage decrease on the node 24 that would turn on the pull-up transistor 11 too quickly and produce a large spike of power supply current. Like the situation of excessive ground current, this supply current flowing through the inductive elements of the package environment and bus circuitry creates noise and is to be avoided.

As the output node 13 rises from low to high during $T_4$, the inverters 43 and 44 again begin to change states and ultimately serve to shut off the compensation circuit 31 by putting the transistor 54 in an off state. This transistor 54 also inhibits DC current flow through the compensation circuit while the Data pin 20 remains high. The inverters 43 and 44 again provide a delay to allow the compensation circuitry to work effectively, i.e., perform its function during the early part of a transition then shut off and allow the outputs of the predrivers to control.

Figure 3:
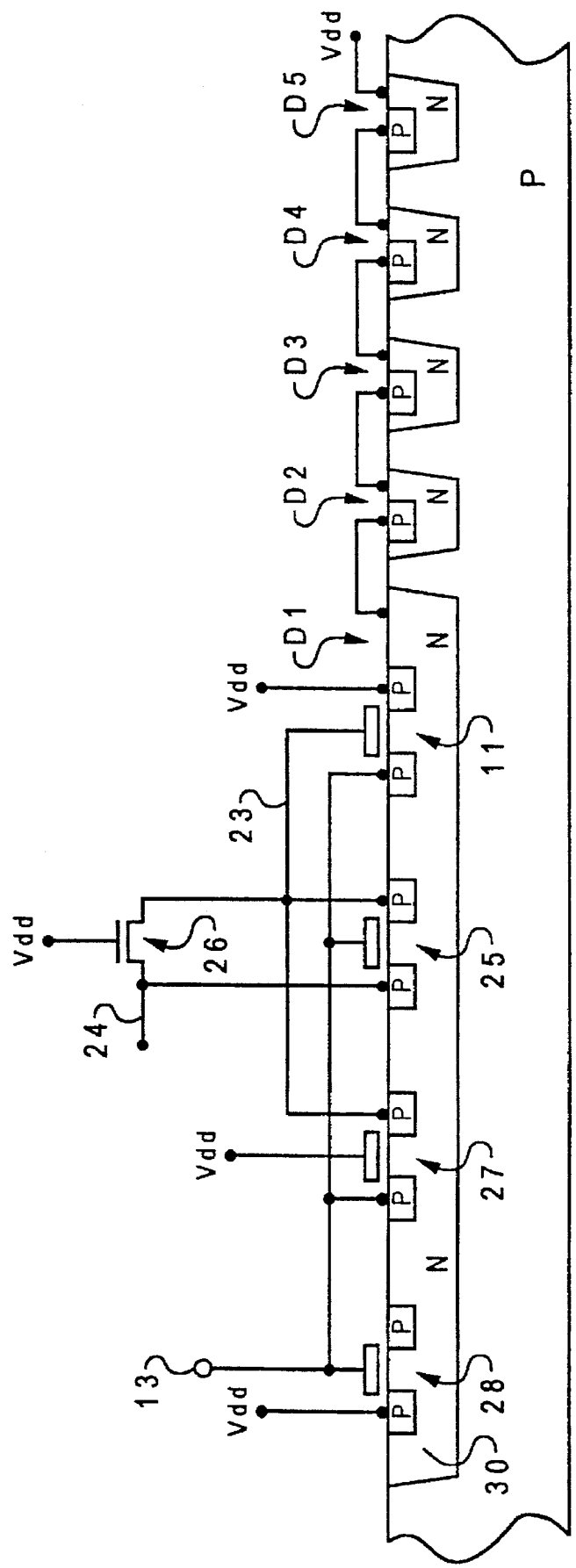
FIG. 3 is an elevation view in section of a small part of a semiconductor chip containing a part of the driver circuit of FIG. 1.

The overvoltage protection for the nodes 23 and 24 is provided by the N-well devices in a manner similar to that described in U.S. Pat. No. 5,151,619. The four P-channel transistors 11, 25, 27, and 28 which are in the same N-well 30 as seen in FIG. 3, where a semiconductor chip 60 is shown in diagrammatic form. The sources and drains of the P-channel transistors are seen as P-implanted regions in the N-well 30. The P-channel transistor 27 shunting the output node 13 to the gate node 23 allows the gate to follow the node 13 when it goes above the supply voltage $V_{dd}$, because the gate of transistor 27 will be lower than node 13, allowing transistor 27 to turn on and conduct charge to the node 23 when node 13 is higher than gate node 23. However, this excess charge on node 23 will be prevented from going back to node 24 by the P-channel transistor 25, which will then have its gate at the same voltage as its drain (node 23), causing it to be in an off condition. The pass gate formed by transistors 25 and 26 will pass full-rail voltage from node 24 to node 23, however, when node 13 is lower, at "0," for example. The transistor 28 merely functions to source the N-well to $V_{dd}$ when the output node 13 is low, at "0," for example.

According to a feature of the invention, a diode stack 61 is connected between the N-well of pull-up transistor 11 and $V_{dd}$ line 14. The embodiment shown uses live diodes D1–D5 in the diode stack 60. The first diode D1 is created by the intrinsic diode of the pull-up transistor 11, i.e., its drain-to-channel PN-junction. This diode stack 61 provides protection from the potentially large overshoots that may be seen in the 5-volt environment of the external buses. Since these overshoots could cause damage to a chip running at a lower voltage supply, it is important to clamp the voltage on the chip supply line 14 while not clamping the bus (output node 13) below 5.5 V. The diodes D1–D5 perform this function. The diode stack 61 will clamp the bus (node 13) to a voltage nominally 2.5–3.0 V (the forward voltage drop of five silicon PN junctions) above the chip power supply line 14. Hence, for a chip with a 3.0 V supply, bus overshoots should be clamped to about 5.5–6.0 V. This is an important feature for the so-called PCI bus environment. The diodes D1–D5 of the stack 61 are seen in FIG. 3. Each diode (except for D1) is in its own N-well, which forms its cathode electrode. A P-implanted region like a P-channel source/drain forms the anode of each diode. The intrinsic diode created by the source/drain P-region of the transistor 11 and its N-well is the diode D1, providing a significant saving in area on the chip since another N-well need not be created tier D1. The number of diodes 61 in the stack may be some number other than five, depending upon the power supply mix which is to be connected to the external buses.

An important feature of the circuit of FIG. 1 is the modification of the compensating circuit 36 to use an N-channel device. In prior compensator circuits of this type, the device corresponding to the function of the transistor 49 was a P-channel transistor (driven through an inverter 34), and it was found that the tracking of the bias point 51 with process variations and temperature changes was not optimum. It is advantageous to use a N-channel device here which is selected to set the bias point at the proper level, along with the other transistors in the stack, and to reduce the process and temperature sensitivity of the circuit.

While the invention has been particularly shown and described with reference to a preferred embodiment, it will be understood by those skilled in the art that various changes in form and detail may be made therein without departing from the spirit and scope of the invention.

What is claimed is:

1. An output driver circuit for a semiconductor chip, comprising:
   a) a predriver circuit having a data input, an enable input, a first data output, and a second data output;
   b) a push, pull out put circuit having an output node for coupling to an off-chip connection, and having first and second inputs, said first input of said output circuit being coupled to receive said first data output of said predriver circuit;
   c) a first compensator circuit having inputs coupled to said data input, said enable input, and said first data output of said predriver circuit;
   d) a second compensator circuit having inputs coupled to said data input, said enable input, and said second data output of said predriver circuit; said first and second compensator circuits preventing change of voltage on said first and second inputs of said push-pull output circuit at a rate as high as the rate of change of voltage at said first and second data output; and
   e) a circuit formed in a well of said semiconductor chip, having an input coupled to receive said second data output of said predriver circuit and having an output coupled to said second input of said push-pull output circuit; said circuit formed in a well preventing damage to said output driver circuit due to overvoltage on said output node.

2. An output driver circuit for a semiconductor chip, comprising:
   a) a predriver circuit having a data input, an enable input, a first data output, and a second data output;
   b) a push-pull output circuit having an output node for coupling to an off-chip connection, and having first and second inputs, said first input of said output circuit being coupled to receive said first data output of said predriver circuit; wherein said push-pull circuit includes a P-channel pull-up transistor and an N-channel Pull-down transistor, said first input of said push-pull output circuit connected to a gate of said P-channel pull-up transistor, said second input of said push-pull output circuit being connected to a gate of said N-channel pull-down transistor;
   c) a first compensator circuit having inputs coupled to said data input, said enable input, and said first data output of said predriver circuit; and d) a second compensator circuit having inputs coupled to said data input, said enable input, and said second data output of said predriver circuit; said first and second compensator circuits preventing change of voltage on said first and second inputs of said push-pull output circuit at a rate as high as the rate of change of voltage at said first and second data output; and e) a feedback circuit from a drain node of said pull-down transistor to a third input of said first and second compensating circuits, said feedback circuit causing said compensator circuits to cease the compensating function after a selected delay following a transition of the voltage on said output node.

3. An output driver circuit according to claim 2, wherein said first and second compensating circuits each include a plurality of P- and N-channel transistors having source-to-drain paths connected in series.

4. An output driver circuit according to claim 2, including a stack of diodes connected in a forward direction between the well of said P-channel pull-up transistor and a terminal of a voltage supply.

5. An output driver circuit according to claim 4, including:

a circuit formed in a well of said semiconductor chip, having an input coupled to receive said second data output of said predriver circuit and having an output coupled to said gate of said P-channel pull up transistor of said push-pull output circuit; said circuit formed in a well preventing damage to said output driver circuit due to overvoltage on said output node.

6. An output driver circuit according to claim 5, wherein one of said diodes is a PN junction of said P-channel pull-up transistor and the remaining one of said diodes are formed in wells separate from said N-well.

7. An output driver circuit according to claim 6, including a feedback circuit from a drain node of said pull-down transistor to a third input of said first and second compensating circuits, said feedback circuit causing said compensator circuits to cease the compensating function after a selected delay following a transition of the voltage on said output node.

8. An output driver circuit according to claim 7, wherein said first and second compensating circuits each include a plurality of P- and N-channel transistors having source-to-drain paths connected in series.

9. A driver circuit comprising:

a) a predriver circuit having a data input, and having data output means;

b) an output driver circuit having an input coupled to said data output means of said predriver circuit which includes a stack of diodes connected in a forward direction between the output driver circuit and a terminal of a voltage supply;

c) a compensation circuit coupled to said predriver circuit and said output driver circuit;

d) clamping means, coupled to said driver circuit, for limiting the voltage to which said circuits in said driver circuit may be exposed during operation.

10. An output driver circuit according to claim 9, including:

a circuit formed in a well of a semiconductor chip containing said output driver circuit, having an input coupled to said data output means of said predriver circuit and having an output coupled to said input of said output driver circuit: said circuit formed in a well preventing damage to said output driver circuit due to overvoltage on said output node.

11. An output driver circuit according to claim 10, wherein said output driver circuit includes a P-channel pull-up transistor and an N-channel pull-down transistor said input of said output driver circuit including a gate of said P-channel pull-up transistor and a gate of said N-channel pull-down transistor.

12. An output driver circuit according to claim 11, including a feedback circuit from a drain node of said pull-down transistor to another input of said compensating circuit, said feedback circuit causing said compensator circuit to cease the compensating function after a selected delay following a transition of the voltage on said output node.

13. An output driver circuit according to claim 12, wherein said compensating circuit includes a plurality of P- and N-channel transistors having source-to-drain paths connected in series.

14. An output driver circuit according to claim 13, wherein said plurality of P- and N-channel transistors of said compensating circuit, includes, in order from said terminal of said supply to a gate of a compensating transistor:

a P-channel transistor having a gate connected to said data input;

an N-channel transistor having a gate connected to an enable input;

an N-channel transistor having a gate connected to said another input of said compensating circuit.

\* \* \* \* \*